(12) United States Patent
Tam

(10) Patent No.: US 9,275,706 B2
(45) Date of Patent: Mar. 1, 2016

(54) AUTO-CALIBRATION FOR HIGH SPEED INPUT/OUTPUT

(71) Applicant: SanDisk Technologies Inc., Plano, TX (US)

(72) Inventor: Eugene Jinglun Tam, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 314 days.

(21) Appl. No.: 13/780,676

(22) Filed: Feb. 28, 2013

(65) Prior Publication Data

US 2014/0241082 A1    Aug. 28, 2014

(51) Int. Cl.
| | |
|---|---|
| H04W 72/08 | (2009.01) |
| G11C 7/22 | (2006.01) |
| G11C 29/02 | (2006.01) |
| G06F 13/16 | (2006.01) |
| G11C 7/10 | (2006.01) |
| G11C 7/04 | (2006.01) |

(52) U.S. Cl.
CPC ............ *G11C 7/222* (2013.01); *G06F 13/1689* (2013.01); *G11C 29/022* (2013.01); *G11C 29/023* (2013.01); *G11C 29/028* (2013.01); G11C 7/04 (2013.01); G11C 7/1066 (2013.01); G11C 7/1093 (2013.01); G11C 2207/2254 (2013.01)

(58) Field of Classification Search
CPC combination set(s) only.
See application file for complete search history.

(56) References Cited

U.S. PATENT DOCUMENTS

| | | | | |
|---|---|---|---|---|
| 6,185,141 | B1 * | 2/2001 | Hoshita ................... | G11C 7/12 365/194 |
| 2004/0052321 | A1 * | 3/2004 | Sakai ..................... | H04J 3/0629 375/354 |
| 2004/0123207 | A1 * | 6/2004 | Zumkehr ............. | G11C 7/1051 714/744 |
| 2005/0166110 | A1 * | 7/2005 | Swanson ........ | G01R 31/318328 714/728 |
| 2005/0259504 | A1 | 11/2005 | Murtugh et al. | |
| 2006/0033544 | A1 | 2/2006 | Hui et al. | |
| 2008/0246461 | A1 | 10/2008 | Abuhamdeh et al. | |
| 2010/0271063 | A1 * | 10/2010 | Hasegawa ........ | G11C 29/56008 324/756.04 |
| 2012/0278783 | A1 | 11/2012 | Nikitin et al. | |

* cited by examiner

*Primary Examiner* — Fan Ng

(74) *Attorney, Agent, or Firm* — Davis Wright Tremaine LLP

(57) ABSTRACT

A delay and calibration circuit for an input/output determines an appropriate delay by trying a range of different delays, and for each delay, determining the number of times that a given data sequence is accurately received. The data sequence may be a command, address, host data, or other data. Appropriate delays may be found for different temperatures.

24 Claims, 9 Drawing Sheets

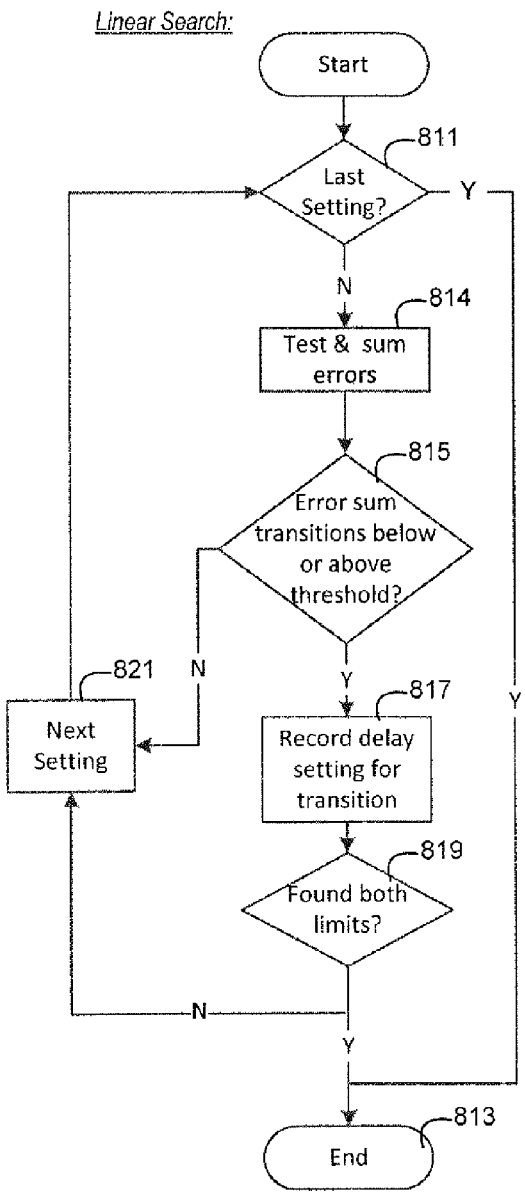
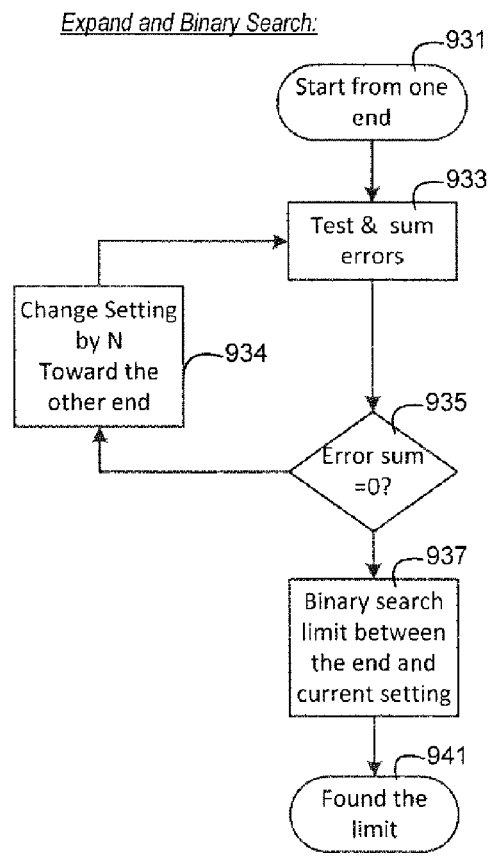
FIG. 8
FIG. 9

AUTO-CALIBRATION FOR HIGH SPEED INPUT/OUTPUT

BACKGROUND

This application relates to communications between integrated circuits and particularly to delays applied to digital signals in communication channels between integrated circuits, and to systems and methods for automatically calibrating such delays.

In many situations multiple integrated circuits (ICs) are connected together as part of a larger assembly, for example, on a printed circuit board. Such integrated circuits may be in communication through high-speed communication channels such as provided by parallel communication channels. Examples of such multi-IC arrangements include memory systems where a memory controller may be connected to multiple memory ICs. For example, DRAM, SRAM, and flash memory may be assembled in such multi-IC arrangements.

One type of flash memory that has become particularly popular for mass data storage applications is NAND flash memory. NAND flash memory is cost-effective for mass data storage, where data is not being frequently replaced or updated. For example, USB thumb drives, and Solid State Disks (SSDs) often use NAND flash memory for mass data storage. NAND flash memory chips are generally considered as commodity products that may meet some standardized specifications and communicate through standardized interfaces (e.g. "Legacy" Asynchronous mode and "Toggle Mode" interfaces). In addition to memory cells connected in a NAND configuration, a NAND flash memory chip generally includes peripheral circuits and controller interface circuits that manage communication with a NAND flash memory controller.

A NAND flash memory controller is typically provided within a NAND flash memory system to perform a variety of functions that may include logical-to-physical address translation, Error Correction Coding (ECC), bad-block management, management of multiple NAND flash memory chips, communication with a host system, and other functions. The NAND flash memory controller is located between the NAND flash memory and the host so that the host accesses the NAND flash memory through the controller. A NAND flash memory controller is typically formed as a dedicated chip, an Application Specific Integrated Circuit (ASIC) that is designed to perform the particular functions needed in a particular memory system. Alternatively, some sort of general purpose memory controller may be loaded with firmware that is specific to a particular application. In either case, a NAND flash memory controller chip, separate from the NAND flash memory chip, or chips, is provided and connected between the NAND flash memory and the host.

NAND flash memory systems communicate with host systems over a variety of different interfaces such as USB, Compact Flash (CF), Secure Digital (SD), etc., which allow memory systems to be easily removed from one host and subsequently connected to another host that has an appropriate interface. In contrast, NAND flash memory controller chips and NAND flash memory chips are generally hardwired to each other (bonded together within the same package, or on the same PCB) and are not configured to be removable. Typically, they are connected together using a simple parallel interface to allow high-speed data transfer. In many cases, a large number of NAND chips are connected to a memory controller to form a large memory such as an SSD. Rapid reliable communication between such integrated circuits is important to overall performance of such an assembly. Skew is one problem that may affect such communication between ICs. One solution to skew may be to reduce clock speeds but this has a negative impact on performance. In some cases, a suitable delay may be used to counteract skew.

SUMMARY

According to an example, a circuit is provided that performs automatic determination of an appropriate delay that can be used to reduce or eliminate skew in a communication channel without reducing clock speed. A repeated set of data bits is sent through the communication channel and the number of accurately received sets is counted with the delay set to a particular period. Then another iteration is performed with the delay set to a different period. The number of correctly received data sets gives an indication of whether a delay is suitable for reducing skew. An appropriate delay may be chosen according to the data so that it is in the middle of a range that provides low, or no, errors. Circuits that are calibrated in this way may be on a memory chip, a memory controller chip, or both.

An example of a method of calibrating delay in a communication channel includes: (a) performing a plurality of test-pattern transmission iterations with a plurality of different delay periods, each test-pattern transmission iteration comprising: setting the delay period for the test-pattern transmission iteration; transmitting a test-pattern through the communication channel n times while applying the set delay period; and receiving the test-pattern accurately from the channel m times, where m is a variable that is less than or equal to n; and (b) determining an appropriate delay period for the channel from values of m obtained for the plurality of different delay periods.

The appropriate delay period may be chosen because it provides the highest value of m of the plurality of different delay periods. Delay periods of a sequential subset of the plurality of different delay periods may each provide the highest value of m, and the appropriate delay period may be the delay period at a midpoint of the sequential subset. The test-pattern may be a command. Accuracy of a received version of the command may be established from being received more times than any other received version of the command within a test-pattern transmission iteration. The test-pattern may be transmitted through the communication channel from a transmitter to a receiver and the delay period may be set at the transmitter. The test-pattern may be transmitted through the communication channel from a transmitter to a receiver and the delay period may be set at the receiver. The test-pattern may be transmitted through the communication channel from a transmitter to a plurality of receivers and the appropriate delay period may be obtained from values of m obtained for the plurality of receivers. The delay period for a test-pattern iteration may be set prior to transmitting the test-pattern. The test-pattern may be transmitted through the communication channel from a transmitter to a plurality of receivers and different appropriate delay periods may be obtained for different groups of receivers of the plurality of receivers. The test-pattern may be a host data pattern. The value of m obtained from a first test-pattern transmission iteration with a first delay period may be used to calculate a second delay period that may be used in a subsequent second test-pattern transmission iteration. The plurality of different delay periods may be a predetermined pattern of delay periods. The plurality of test-pattern transmission iterations may be performed at a first temperature and the appropriate delay period may be a first delay period that is appropriate for the first temperature, steps (a) and (b) may be repeated at least a second temperature and a second delay period may be determined that is appropriate for the second temperature. The first delay period and the second delay period may be stored, and the first delay period or the second delay period may be selected for use as a channel delay in response to sensing a temperature associated with the communication channel.

An example of a delay calibration circuit on an integrated circuit for calibrating a delay associated with a communication channel includes: a variable delay element connected in series with the communication channel; an error detection circuit that detects errors in a test-pattern received through the communication channel; and a calculation circuit that calculates an optimum delay from numbers of errors detected by the error detection circuit for different delay times of the variable delay element.

The error detection circuit may be a comparator that identifies errors in a repetitive test-pattern. A predictor circuit may use a first number of errors detected by the error detection circuit for a first delay to predict a subsequent second delay according to a search scheme. The search scheme may be a binary search scheme. The integrated circuit may be a memory chip that includes an array of floating gate memory cells. The integrated circuit may be a memory controller chip. The variable delay element may delay transitions from logic 0 to logic 1. The variable delay element may delay transitions from logic 1 to logic 0. The variable delay element may be part of a transmitter connected to the communication channel, and the variable delay element may delay transitions for a plurality of receivers that are connected to the communication channel, A first optimum delay may be calculated for a first subset of the plurality of receivers and a second optimum delay may be calculated for a second subset of the plurality of receivers. The first optimum delay for the first subset of the plurality of receivers may be stored at the transmitter prior to transmitting data to receivers of the first subset of the plurality of receivers. The variable delay element may delay transitions from logic 0 to logic 1 and transitions from logic 1 to logic 0.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 8 is a flowchart for a linear search scheme.

FIG. 9 is a flowchart for a binary search scheme.

DETAILED DESCRIPTION

Aspects of the present invention may be applied to a range of multi-chip assemblies. In particular, any arrangement in which two or more integrated circuits are in communication through a parallel communication channel may suffer from problems associated with skew. Because of different lengths of traces, or other factors, data, address information, commands, clock signals, and other signals, may propagate differently so that they do not arrive at their destination with the correct timing. This may cause sampling of data at the wrong time because of differences between data and clock signals for example. While slower clock speeds may reduce problems of skew it is generally undesirable to reduce clock speeds. One example of a multi-chip assembly in which skew is important, and where reduced clock speed is undesirable, is a memory system. For example, nonvolatile memory systems using flash memory have become common in many applications. While many aspects of the present invention are discussed with respect to flash memory, and specifically mass-storage NAND flash memory systems, it will be understood that aspects of the invention may be applied to any parallel communication between integrated circuits.

Flash Memory System

Figure 1A:
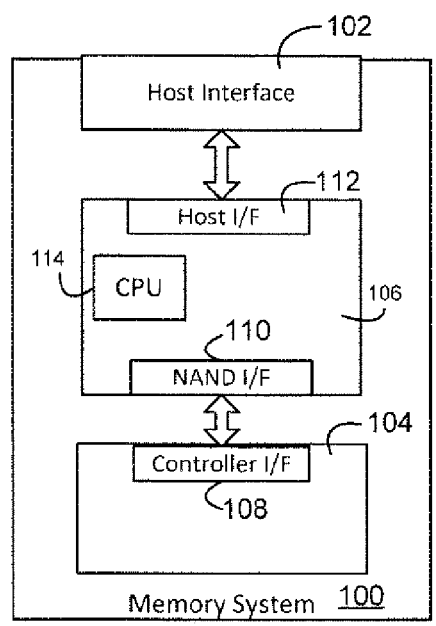
FIG. 1A illustrates the main hardware components of a memory system suitable for implementing aspects of the present invention.

FIG. 1A illustrates schematically the main hardware components of a NAND flash memory system 100 suitable for implementing the present invention. The NAND flash memory system 100 typically operates with a host through the host interface 102 which may follow a predefined standard that allows the NAND flash memory system to interface with a variety of host systems. The NAND flash memory system is typically in the form of a memory card, SSD, or an embedded memory system. The memory system 100 includes a NAND flash memory 104 whose operations are controlled by a NAND flash memory controller 106. The NAND flash memory 104 comprises one or more arrays of non-volatile memory cells distributed over one or more integrated circuit chips, with a controller interface 108 for communication with the NAND flash memory controller 106. The NAND flash memory controller 106 includes a NAND flash memory interface 110, a host interface 112, a Central Processing Unit (CPU) 114, and may include several other components such as Read Only Memory (ROM), and Random Access Memory (RAM).

Figure 1B:
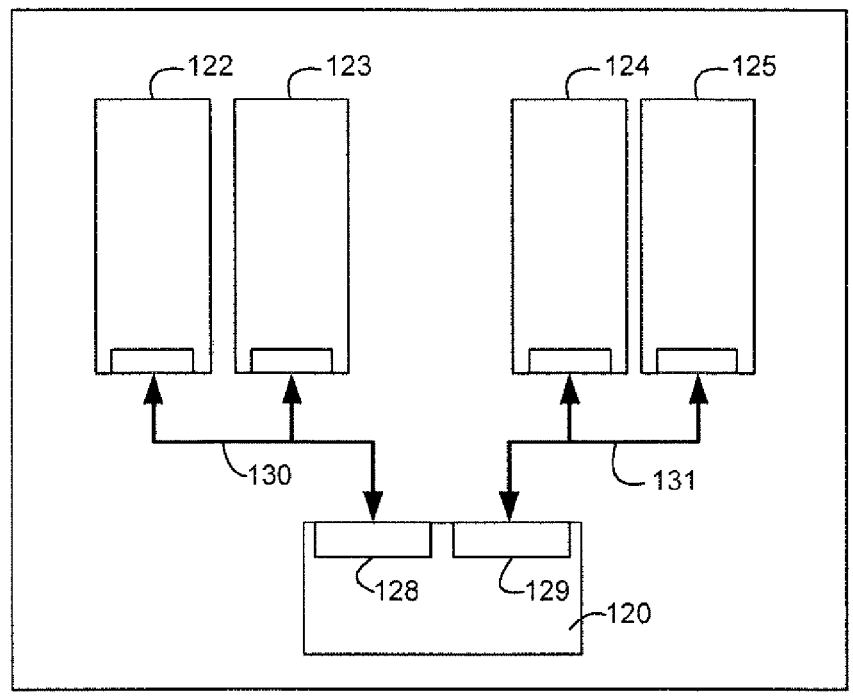
FIG. 1B illustrates another memory system with multiple memory chips, suitable for implementing aspects of the present invention.

FIG. 1B shows a common arrangement in which a single NAND flash memory controller chip 120 communicates with multiple NAND flash memory dies 122-125. Four NAND flash memory dies are shown in this example for simplicity, though many more may be present in some examples. Each die may be on a separate NAND flash memory chip, or two or more dies may be located on the same chip. The NAND flash memory controller chip 120 is shown having two separate NAND flash memory interfaces 128-129, each connected to a separate bus 130-131. Each bus in turn serves two NAND flash memory dies. Such an arrangement, where a controller operates two separate interfaces for two separate busses, may be considered a two-channel arrangement. In some cases, a NAND flash memory controller may operate four, eight, or more channels, and each channel may include a bus that serves four, eight or more NAND flash memory dies. Each interface may include data, address, and clock input/outputs (I/Os) and each channel may contain multiple traces for each of these. For large, multi-chip arrangements, traces may be of different lengths for different ICs, and different signals may be differently affected by long paths to their destinations. A heavily loaded interface that must drive a large number of individual I/Os may produce signals with significant slew (i.e. transition times from low to high, or high to low, are relatively slow).

One way to counter skew caused by different propagation times in different conductors is to add appropriate delays to particular conductors and thus realign signals that would otherwise arrive at their destination at different times. Aspects of the present invention are directed to automatically finding appropriate delays for such signals and applying the appropriate delays so that skew is effectively counteracted without reducing speed.

Figure 2:
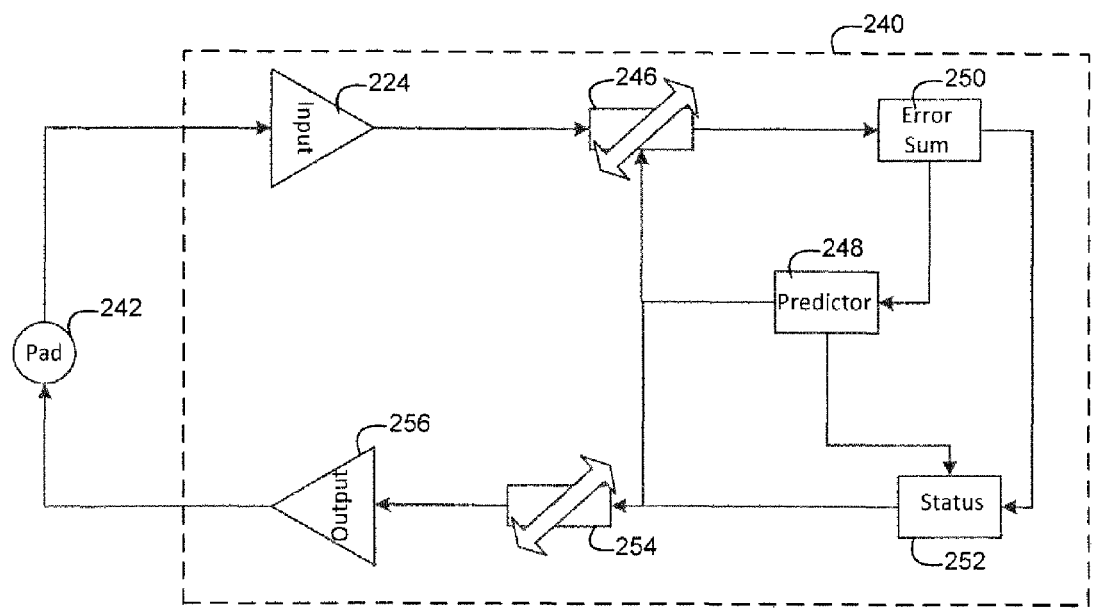
FIG. 2 illustrates a variable delay and calibration circuit.

FIG. 2 shows an example of an input/output circuit 240 with variable delays (an input delay and an output delay) and with circuits for automatically calibrating the delay periods used. An I/O pad 242 is shown, which may be on any integrated circuit (e.g. memory controller or memory IC of FIGS. 1A and 1B). An IC may include a large number of such pads and input/output circuits may be connected to all, or just some, of such pads. Pads are where the IC connects to the outside world and provide a suitable location for applying delays, before input signals are passed to other components of the IC, and immediately before output signals are sent by the IC to the outside.

On the input side, an input amplifier 244 provides received input signals to the input variable delay element 246. Here, the received input signal is delayed by a predetermined amount. The predetermined amount is determined by the predictor 248. During normal operation, the delayed signal is send to other components of the IC after the predetermined delay is applied. During a calibration operation, the delayed signal is sent to an Error Sum circuit 250 where it is compared with a prior signal and from this the predictor circuit 248 may determine a subsequent delay period to apply. Thus, during the calibration operation, the predictor circuit 248 may apply a series of different delays in an adaptive manner depending on the results from earlier delay periods. Alternatively, the predictor circuit 248 may apply a predetermined set of delays, or may use some other scheme to determine which delay periods to apply. A status element 252 is provided to indicate whether an appropriate delay period has been found, or whether calibration is still needed, or is ongoing.

On the output side, signals coming from other components of the IC that are to be provided as output signals are subject to a variable delay, by a variable delay element 254, that is set by the predictor circuit 248. The predictor circuit 248 may apply a series of different delays in order to find an appropriate delay. The delayed output signal is sent to an output amplifier 256 which then applies the amplified, delayed output signal to I/O pad 242. The delayed output may then be sent through a communication channel and a receiver may perform some analysis of the received data for each delay used. Alternatively, the receiver may simply send back the received data for analysis by the input/output circuit 240.

Figure 3A:
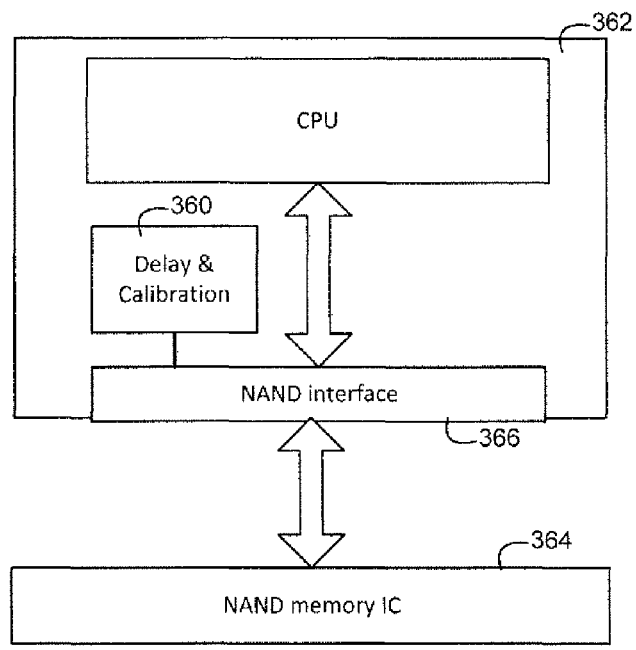
FIG. 3A illustrates a memory controller that includes a variable delay and calibration circuit.

Input/Output circuit 240 performs calibration of both input and output delays. Input and output delays may be applied and calibrated together in the same IC or may be applied and calibrated separately on different ICs. For example, in a memory system, it may be convenient to locate all such calibration circuits and delay circuits in a memory controller ASIC so that memory ICs do not need such circuits. An example of such an arrangement is shown in FIG. 3A, which shows calibration and delay circuits 360 in memory controller 362 that is in communication with one or more NAND memory ICs, such as NAND memory IC 364, through NAND interface 366.

Figure 3B:
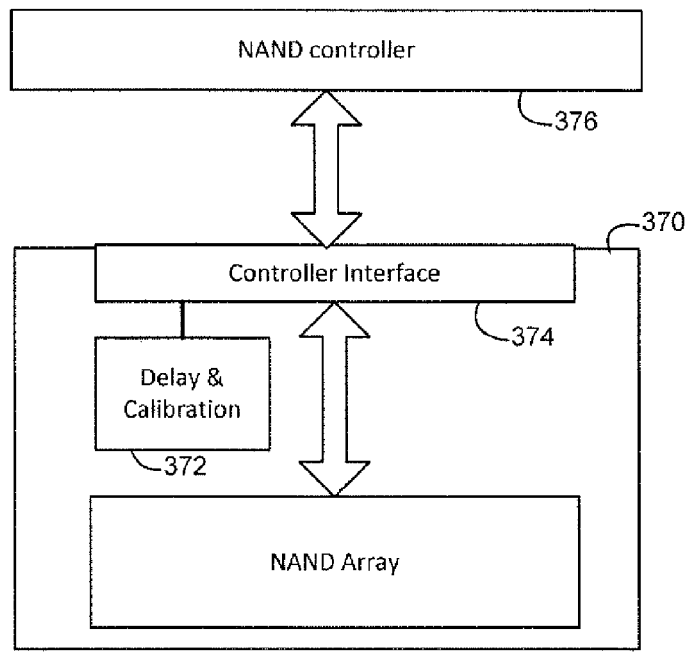
FIG. 3B illustrates a memory IC that includes a variable delay and calibration circuit.

In other cases, such circuits may be located on a memory chip so that all calibration and delay circuits are on the memory chip and no calibration or delay circuits are on the memory controller IC. An example of this arrangement is shown in FIG. 3B. NAND memory IC 370 includes delay and calibration circuits 372 connected to controller interface 374, which is in communication with NAND controller 376. Thus, each memory IC may adapt to its communication channel (which may be different from communication channels of other memory ICs).

Figure 3C:
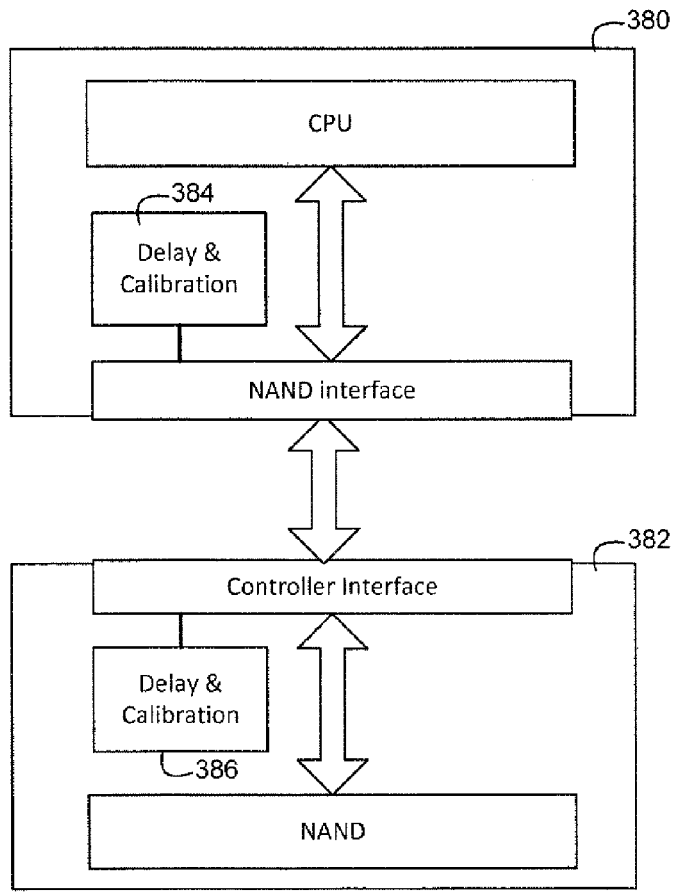
FIG. 3C illustrates a memory controller and memory IC that each include variable delay and calibration circuits.

In still other cases, calibration and delay circuits may be provided at both ends of a communication channel. Thus, as shown in FIG. 3C, both a memory controller IC 380 and a NAND memory IC 382 contain calibration and delay circuits (calibration and delay circuits 384, and 386 respectively) that work together to provide appropriate delays for communication channels. For example, each IC may have input delays only so that no output delays are needed (delays are provided by the receiver so that the sender does not need to provide a delay). Calibration may be performed by calibration in both ICs in this case.

Finding Appropriate Delay

Various schemes may be used to find an appropriate delay for a given signal under a given set of conditions. According to an example, a set of data bits which form a test pattern is sent through a channel a predetermined number of times and is subject to a predetermined delay. Each received set of bits is compared to the previously received set of bits and only sets of bits that are received more than a certain number of times are counted. Thus, for example, for a given delay, the set of bits may be sent ten times, but only a received set of data that is repeated at least five times is counted (e.g. received seven times). Thus, incorrectly received data is discarded and the number of correctly received copies for any given delay setting is recorded. (It may be assumed that a repeatedly received pattern of data is correct data.) Then another iteration is performed using a different delay setting.

Figure 4:
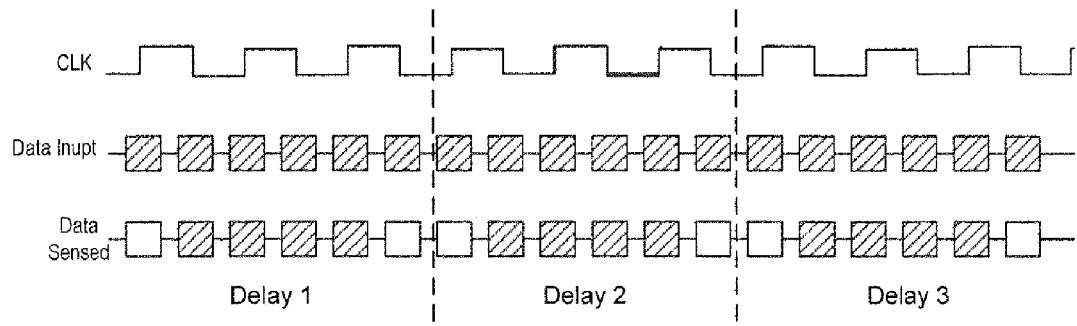
FIG. 4. illustrates how a set of data may be repeatedly sent with the number of correctly received sets depending on the delay used.

FIG. 4 shows an example of three iterations, using three different delay periods (Delay 1, delay 2, and delay 3), with six copies of a set of data sent in each iteration as indicated by hashed entries on the Data Input line. Four successive sets of correct data are received in each iteration as shown by hashed entries on the Data Sensed line. The set of data used for such testing may correspond to host data, command data, address data, clock signals, or other sequences of data bits. All data is sent at a desired clock frequency, CLK, so that delays are calibrated for the desired clock frequency which is generally a relatively high clock frequency. In the example of FIG. 4, sampling occurs on both rising and falling clock edges in what may be referred to as "toggle mode" which has twice the data rate of conventional sampling on only one clock edge.

In one scheme, the number of bad copies, or correct copies of a data set is recorded for each value of the delay period used (e.g. Delay 1: 4 good copies; Delay 2: 4 good copies; Delay 3: 4 good copies). Thus, each iteration may provide a number that reflects the effect of the delay period used for that iteration.

Figure 5:
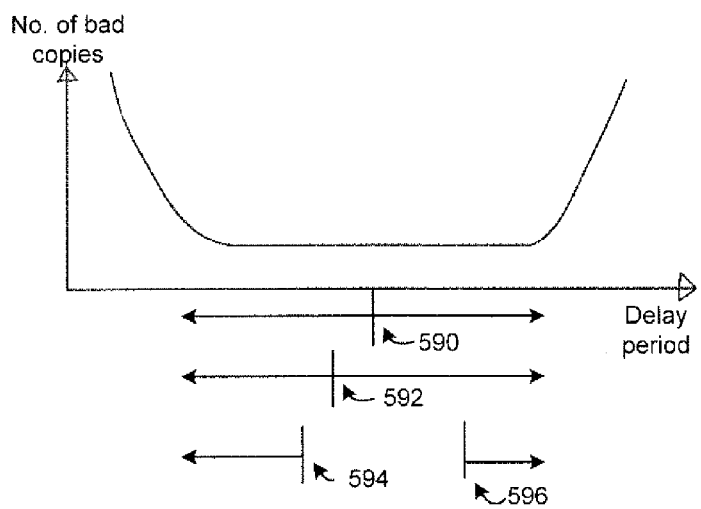
FIG. 5 illustrates how an appropriate delay may be selected based on characterization of a range of delay settings.

FIG. 5 shows an example of results for a number of iterations, where each iteration uses a different delay period. It can be seen that the results generate a bathtub curve, with increasing numbers of bad copies at each end and a low number (which may be zero) for a range of delay periods in the middle. An appropriate delay setting may be found from this curve (or the data represented by the curve) in a number of ways. For example, the center of the bottom portion of the curve 590 may be chosen as shown. Alternatively, the delay may be offset a certain amount from the center, for example, as shown by delay 592. In another example, the appropriate delay may be a fixed offset from one wall or the other as shown by delay 594 and delay 596. Other schemes may also be used to obtain an appropriate setting from the data.

Figure 6:
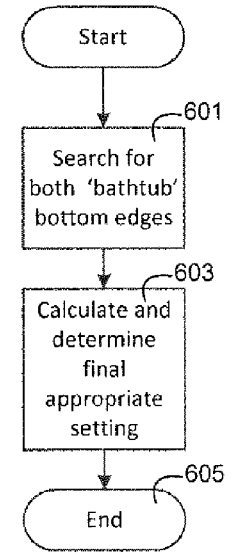
FIG. 6 is a flowchart for a scheme to find an appropriate delay setting.

FIG. 6 is a flowchart showing a process for finding an appropriate delay setting from a bathtub curve like that shown in FIG. 5. A search may be performed 601 to find both sides of the bathtub curve and to thus establish the extent of the bottom of the bathtub (i.e. the range of delays that provide low errors). Then an appropriate delay setting is found 603 within the range indicated by the bottom of the bathtub. This delay setting is entered and the calibration operation ends 605.

Figure 7A:
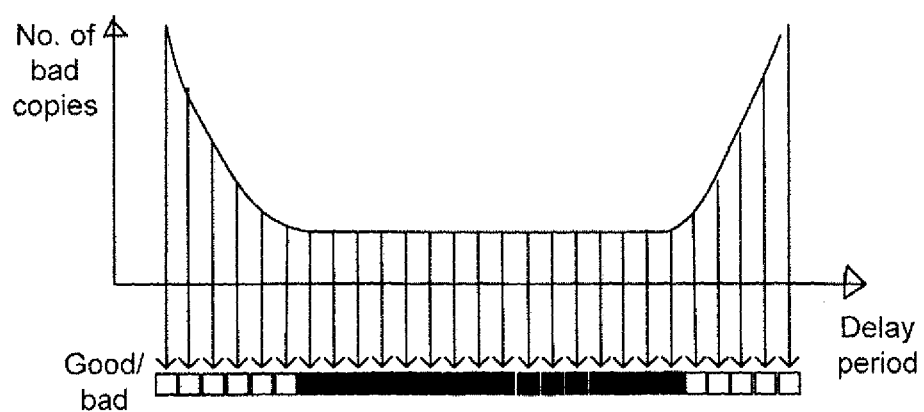
FIG. 7A illustrates a scheme for characterizing delay settings.

FIG. 7A shows a first approach to obtaining delay characterization information. Multiple delay settings are used that span a range that is expected to provide a bathtub curve (i.e. expected to fail at either extreme and to have good results somewhere in between). The delay may be incremented from one iteration to another. It can be seen that in the middle, good results are obtained (indicated by dark entries). At either side, bad results are obtained (indicated by blank entries). Thus, the range for the bottom of the bathtub curve is obtained and an appropriate delay may be chosen within the range.

Figure 7B:
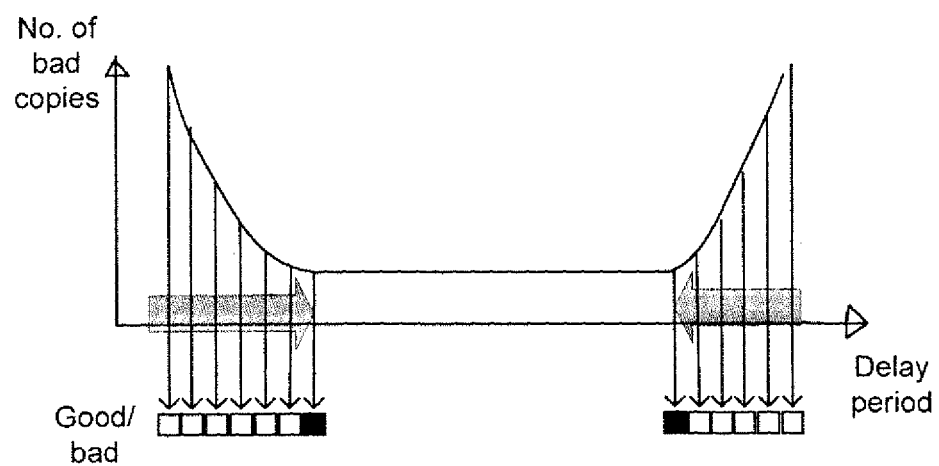
FIG. 7B illustrates another scheme for characterizing delay settings.

FIG. 7B shows a different approach that can use the results of a prior iteration to determine what delay to use for a subsequent iteration. Initially, delay settings follow a predetermined pattern, for example, starting from one side (from minimum or maximum delay) and incrementing (or decrementing) until good results are obtained (indicated by dark entry). At this point, the edge of the bathtub has been found. Rather than proceed through the entire range of delay settings as in FIG. 7A, here, once one edge is established the next edge is sought. This scheme goes to the other extreme and works back until a good result is obtained. Thus, both edges are found without going through as many iterations as in FIG. 7A. It may be assumed that the results remain good between the two edges.

FIG. 8 is a flowchart showing how a linear search operation may be performed. A determination is made 811 as to whether the last setting for the delay has been performed. If it has, then the operation terminates 813. If it has not, then an iteration of testing and summing errors is performed 814 with a given delay setting and the errors are checked 815 to see if the error total dips below a threshold, or low water mark, which indicates the left side of the bathtub curve, or goes above a threshold, or high water mark, after that, which indicates the right side of the bathtub curve. In either of aforementioned cases, the last setting that yields the error total that is below the low water mark is recorded 817. If both sides of the bathtub curve have been found 819, then the operation terminates 813. If there is no transition 815, then the next delay setting is selected 821 and another iteration is begun.

FIG. 9 shows another approach in which a binary search is used. This scheme chooses an initial delay value at one end 931 (either maximum or minimum) and performs an iteration with this delay value 933. If the error sum is not zero 935 then the delay is changed by a predetermined amount towards the other end of the curve 934 and another iteration is performed 933. In this example, the bottom of the bathtub curve is expected to provide no errors ("Error sum=0") though in other examples some errors may be acceptable. If the error sum is zero 935, and the bottom of the curve has been reached, then the delay is set to a value between the beginning end and the current setting 937. In this way, progressing from one end, the side of the bathtub curve may be obtained 941. This may be repeated for the other side.

In systems in which each memory IC has its own delay and calibration circuits, each memory IC is separately calibrated for the channel that connects it to the memory controller. However, where delay and calibration circuits are located on the memory controller, there may be multiple memory chips connected to a single bus so that the memory controller communicates through a single interface with multiple different memory chips. A memory controller may either use a delay that is appropriate for all memory ICs that are connected to the interface in a 1-to-n configuration (but this delay may be a compromise and may cause some errors for some memory ICs). Alternatively, the memory controller may use different delays for different memory ICs depending on which memory IC it is in communication with at any given time. While more complex, this may give better optimized delays for any given communication. In either case, data may be collected for communication with all memory ICs and either a compromise delay is found that works for all memory ICs (e.g. average of individual delays for each memory IC) or individual delays are stored and delay elements are configured with appropriate delay settings depending on the memory IC that is selected.

The above calibration may be performed under a given set of conditions and may be repeated under different conditions to obtain appropriate delays for different conditions. For example, the calibration may be performed at a particular temperature and then repeated at a different temperature so that different appropriate delays are found for different temperatures. In this way, a set of delay settings may be obtained for a range of different conditions and as conditions change the delay settings can be adjusted accordingly. For example, on-chip temperature measurement may be used to determine the temperature of a chip and depending on the temperature measured an appropriate set of delay settings may be selected and used.

Example Circuits

Figure 10:
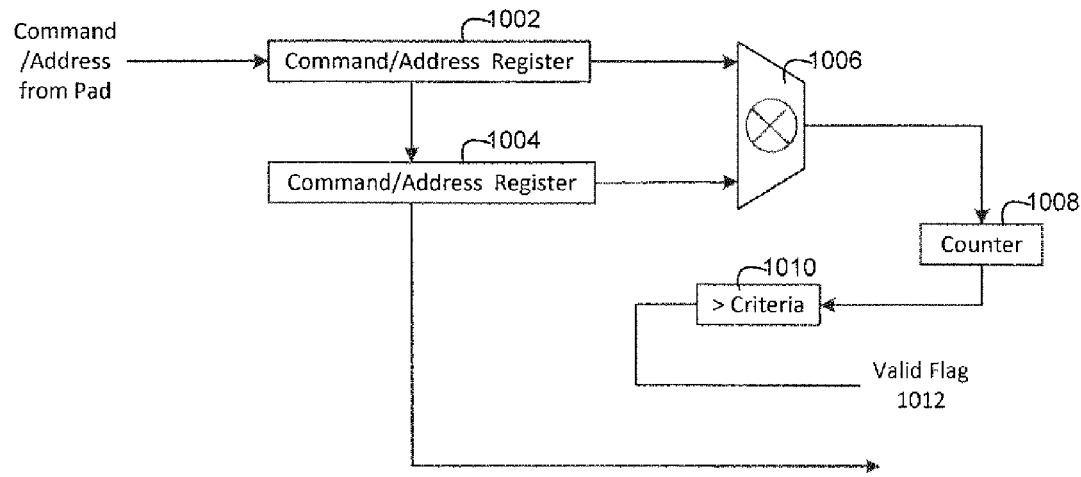
FIG. 10 shows an error counter for a command/address I/O.

FIG. 10 shows a circuit that may be used as an error sum circuit for a command I/O. A command is received and is saved in a command/address register 1002. This command is compared with a prior command that is stored in another register 1004 using a comparator 1006. A counter 1008 counts the number of correct iterations that are received and when the counter 1008 indicates that the number of correct iterations exceeds a predetermined number (as determined by another comparator 1010) then a valid flag 1012 is set that indicates that the delay for the current iteration produces good results.

Figure 11:
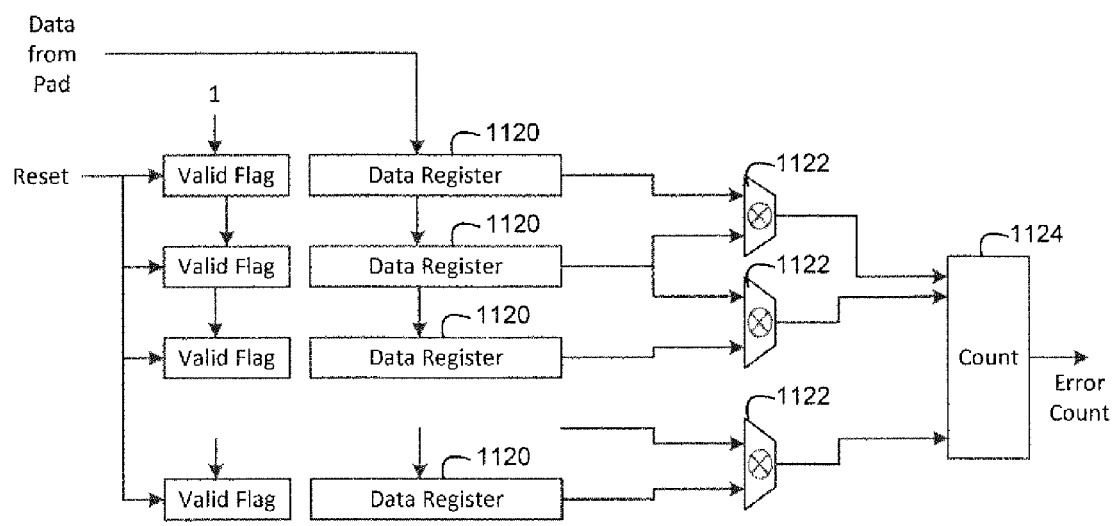
FIG. 11 shows an error counter for a data I/O.

FIG. 11 shows a circuit that may be used as an error sum circuit for a data I/O. Here, a sequence of data received from a pad is stored in multiple registers 1120 where it is compared by a set of comparators 1122 to determine how many copies are identical. A counter 1124 connected to the comparators determines the number of identical copies and may send the number of identical copies (good copies) or may subtract the number of identical copies from the number of copies that should have been received to obtain the number of bad copies (error count).

Figure 12:
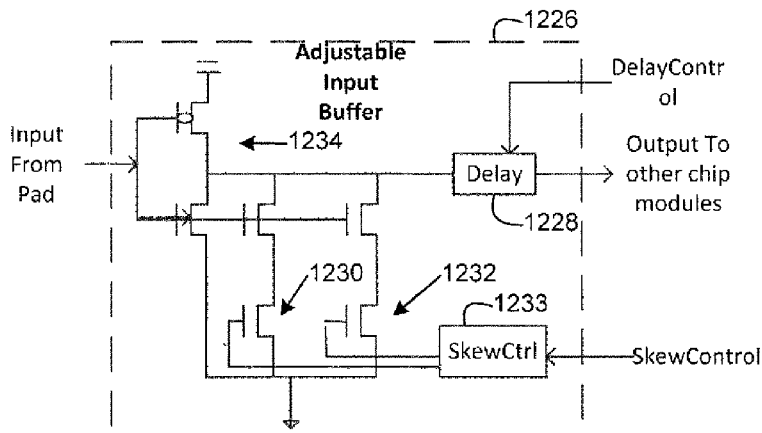
FIG. 12 shows an adjustable input buffer.

FIG. 12 shows an example of an adjustable input buffer 1226 that includes a delay element 1228 that can be calibrated as described above. FIG. 12 further shows Skew Control transistors 1230, 1232 that control skew. If either or both transistors 1230, 1232 are enabled by skew control circuit 1233, the trig point of the inverter 1234 in the input buffer is lower. This makes sensing higher to low input transition faster and low to high transition slower.

Figure 13:
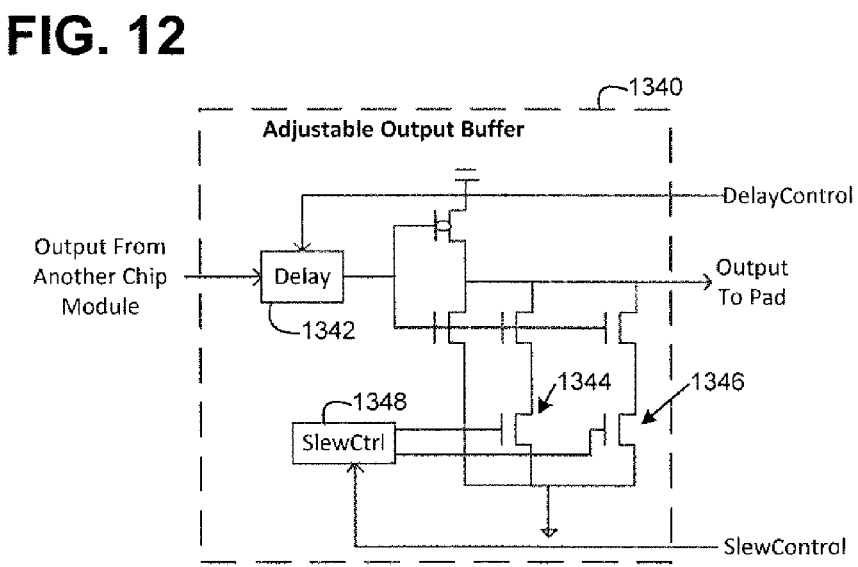
FIG. 13 shows an adjustable output buffer.

FIG. 13 shows an example of an adjustable output buffer 1340 that includes a delay element 1342 that can be calibrated as described above. If either or both transistors 1344, 1346 are enabled by slew control circuit 1348, output transition from high to low is faster, and transition for low to higher is slower.

Figure 14:
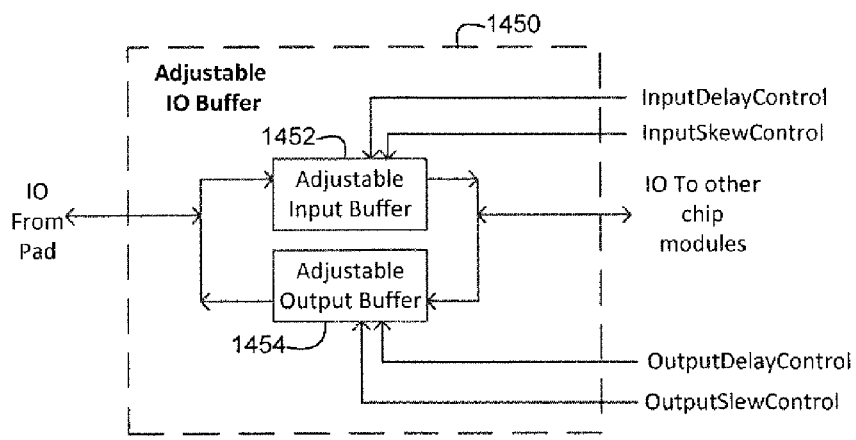
FIG. 14 shows an adjustable I/O buffer.

FIG. 14 shows an example of an adjustable I/O buffer 1450 that includes a separate adjustable input buffer 1452 and an adjustable output buffer 1454, which may be as shown in FIGS. 12 and 13. Either the adjustable input buffer 1452 or the adjustable output buffer 1454 may be used depending on whether an input is being received by the I/O pad, or an output is being provided to the output pad. Each buffer has delay control and skew/slew control signals so that it can be adjusted and calibrated.

Figure 15:
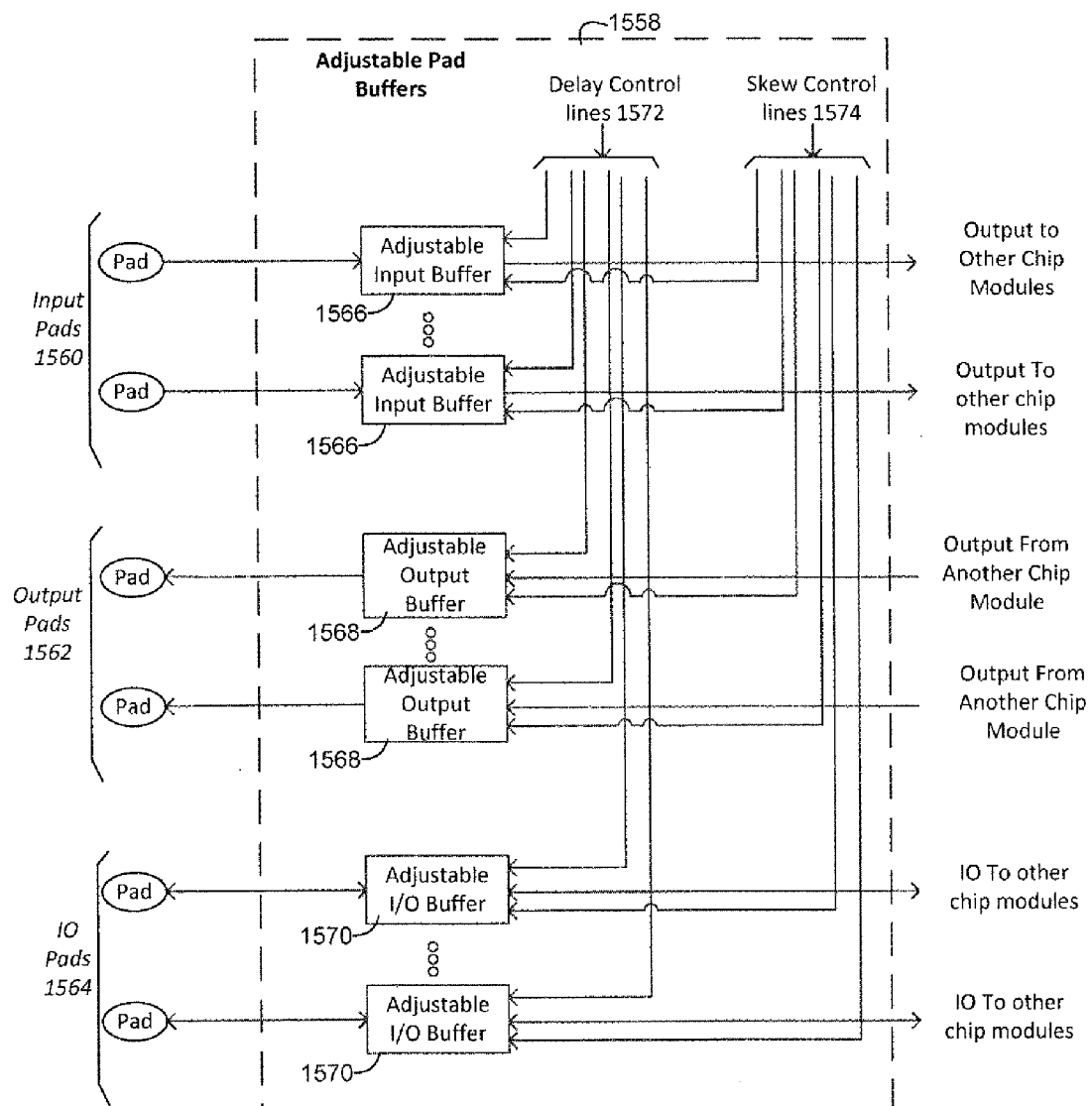
FIG. 15 shows how adjustable buffers may be connected in an IC.

FIG. 15 shows an example of a set of adjustable pad buffers 1558 that include a set of input pads 1560, output pads 1562, and I/O pads 1564 on an IC. Each pad is connected to an adjustable buffer of the corresponding type (input pads 1560 to input buffers 1566, output pads 1562 to output buffers 1568, and I/O pads 1564 to I/O buffers 1570). A set of delay control lines 1572 allow central control of all buffer delays and a set of skew/slew control lines 1574 allow central control of skew in all buffers. Thus, a set of buffers may be calibrated and controlled by a central unit.

CONCLUSION

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of calibrating delay in a communication channel between a memory controller chip and a NAND flash memory die comprising:
   (a) performing a plurality of test-pattern transmission iterations with a plurality of different delay periods, each test-pattern transmission iteration comprising:
       setting the delay period for the test-pattern transmission iteration;
       transmitting a test-pattern through the communication channel between the memory controller chip and the NAND flash memory die n times in the test-pattern transmission iteration, where n is greater than or equal to two, while applying the set delay period;
       receiving the test-pattern accurately from the communication channel m times in the test-pattern transmission iteration, where m is a variable with a range from zero to n, accuracy of a received version of the command data is established from being identically received a plurality of times in series that is more than any other received version of the command within a test-pattern transmission iteration; and
   (b) determining an appropriate delay period for the communication channel from values of m obtained for the plurality of test-pattern transmission iterations with different delay periods; and;
   wherein the test-pattern is transmitted through the communication channel from a transmitter to a plurality of receivers and different appropriate delay periods are obtained for different groups of receivers of the plurality of receivers.

2. The method of claim 1 wherein the communication channel forms a hard-wired connection between the memory controller chip and the NAND flash memory die.

3. The method of claim 2 wherein delay periods of a sequential subset of the plurality of different delay periods each provide the highest value of m, the highest value of m being four or more, and the appropriate delay period is the delay period at a midpoint of the sequential subset.

4. The method of claim 1 wherein the test-pattern is command data.

5. The method of claim 1 wherein the test-pattern is transmitted through the communication channel from a transmitter in the memory controller chip to a receiver in the NAND flash memory chip and the delay period is set at the transmitter.

6. The method of claim 1 wherein the test-pattern is transmitted through the communication channel from a transmitter in the memory controller chip to a receiver in the NAND flash memory chip and the delay period is set at the receiver.

7. The method of claim 1 wherein the test-pattern is transmitted through the communication channel from a transmitter to a plurality of receivers and the appropriate delay period is obtained from values of m obtained for the plurality of receivers.

8. The method of claim 1 wherein delay period for a test-pattern iteration is set prior to transmitting the test-pattern.

9. The method of claim 1 wherein the test-pattern is a host data pattern.

10. The method of claim 1 wherein the value of m obtained from a first test-pattern transmission iteration with a first delay period is used to calculate a second delay period that is used in a subsequent second test-pattern transmission iteration.

11. The method of claim 1 wherein the plurality of different delay periods is a predetermined pattern of delay periods.

12. The method of claim 1 wherein the plurality of test-pattern transmission iterations are performed at a first temperature and the appropriate delay period is a first delay period that is appropriate for the first temperature, further comprising repeating steps (a) and (b) at a second temperature and determining a second delay period that is appropriate for the second temperature.

13. The method of claim 12 further comprising storing the first delay period and the second delay period, and selecting the first delay period or the second delay period for use as a channel delay in response to sensing a temperature associated with the communication channel.

14. A delay calibration circuit on an integrated circuit for calibrating a delay associated with a communication channel comprising:

a variable delay element connected in series with the communication channel;

an error detection circuit that detects errors in a test-pattern received through the communication channel by comparing a first number of test-patterns sent through the communication channel with a given delay, where the first number is greater than or equal to two, with a second number of times the test-pattern is accurately received for the given delay, the second number ranging from zero to the first number, the error detection circuit including a comparator that identifies errors in a repetitive test-pattern, by comparing each received test-pattern with an immediately prior test pattern to identify when two or more identical test-patterns are received in series; and a calculation circuit that calculates an optimum delay from numbers of errors detected by the error detection circuit for different delay times of the variable delay element.

15. The delay calibration circuit of claim 14 further comprising a predictor circuit that uses a first number of errors detected by the error detection circuit for a first delay to predict a subsequent second delay according to a search scheme.

16. The delay calibration circuit of claim 15 wherein the search scheme is a binary search scheme that starts with a delay set to a first end of a delay range, then a delay set towards an opposite second end of the delay range to find a first transition between low and high errors, and subsequently sets a delay to the second end of the delay range, then a delay set towards the first end of the delay range to find a second transition between low and high errors.

17. The delay calibration circuit of claim 14 wherein the integrated circuit is a NAND flash memory chip that includes an array of floating gate memory cells.

18. The delay calibration circuit of claim 14 wherein the integrated circuit is a memory controller chip.

19. The delay calibration circuit of claim 14 wherein the variable delay element delays transitions from logic 0 to logic 1.

20. The delay calibration circuit of claim 14 wherein the variable delay element delays transitions from logic 1 to logic 0.

21. The delay calibration circuit of claim 20 wherein the variable delay element is part of a transmitter connected to the communication channel, and the variable delay element delays transitions for a plurality of receivers that are connected to the communication channel.

22. The delay calibration circuit of claim 21 wherein a first optimum delay is calculated for a first subset of the plurality of receivers and a second optimum delay is calculated for a second subset of the plurality of receivers.

23. The delay calibration circuit of claim 22 wherein the first optimum delay for the first subset of the plurality of receivers is stored at the transmitter prior to transmitting data to receivers of the first subset of the plurality of receivers.

24. The delay calibration circuit of claim 14 wherein the variable delay element delays transitions from logic 0 to logic 1 and transitions from logic 1 to logic 0.

* * * * *